(12) United States Patent
Tanaka et al.

(10) Patent No.: US 9,093,643 B2
(45) Date of Patent: Jul. 28, 2015

(54) DEFORMABLE MATERIAL AND ACTUATOR

(71) Applicant: SEIKO EPSON CORPORATION, Tokyo (JP)

(72) Inventors: Hideki Tanaka, Chino (JP); Toshihiro Otake, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 252 days.

(21) Appl. No.: 13/827,752

(22) Filed: Mar. 14, 2013

(65) Prior Publication Data
US 2013/0328443 A1 Dec. 12, 2013

(30) Foreign Application Priority Data

Jun. 12, 2012 (JP) .................................. 2012-133200

(51) Int. Cl.
| | |
|---|---|
| H01L 41/16 | (2006.01) |
| H01L 41/00 | (2013.01) |
| H01L 41/193 | (2006.01) |
| B82Y 30/00 | (2011.01) |
| F03G 7/00 | (2006.01) |

(52) U.S. Cl.
CPC .............. *H01L 41/193* (2013.01); *B82Y 30/00* (2013.01); *F03G 7/005* (2013.01); *Y10S 977/832* (2013.01)

(58) Field of Classification Search
USPC ........................................................ 310/800
See application file for complete search history.

(56) References Cited

U.S. PATENT DOCUMENTS

| | | | | |
|---|---|---|---|---|
| 8,436,117 | B2 * | 5/2013 | Otake ............................ | 526/256 |
| 2007/0190150 | A1 * | 8/2007 | Ito et al. ......................... | 424/486 |
| 2010/0312322 | A1 * | 12/2010 | Eidenschink et al. ........ | 623/1.11 |
| 2011/0250511 | A1 * | 10/2011 | Samukawa et al. ............ | 429/401 |
| 2013/0264972 | A1 * | 10/2013 | Hashimoto et al. ........... | 318/116 |

FOREIGN PATENT DOCUMENTS

JP    A-2013-126268    6/2013

* cited by examiner

*Primary Examiner* — Thomas Dougherty
(74) *Attorney, Agent, or Firm* — Oliff PLC

(57) ABSTRACT

A deformable material according to an embodiment of the invention includes a stimulus-responsive compound whose molecular structure is changed according to an oxidation-reduction reaction and an electronically conductive substance. The stimulus-responsive compound is a polymer obtained by polymerizing a constituent unit having a polymerizable functional group. The electronically conductive substance is preferably in the form of particles in the deformable material. Further, the electronically conductive substance preferably has an average particle diameter of 1 nm or more and 10 μm or less. Further, the electronically conductive substance preferably contains a carbon material.

20 Claims, 6 Drawing Sheets

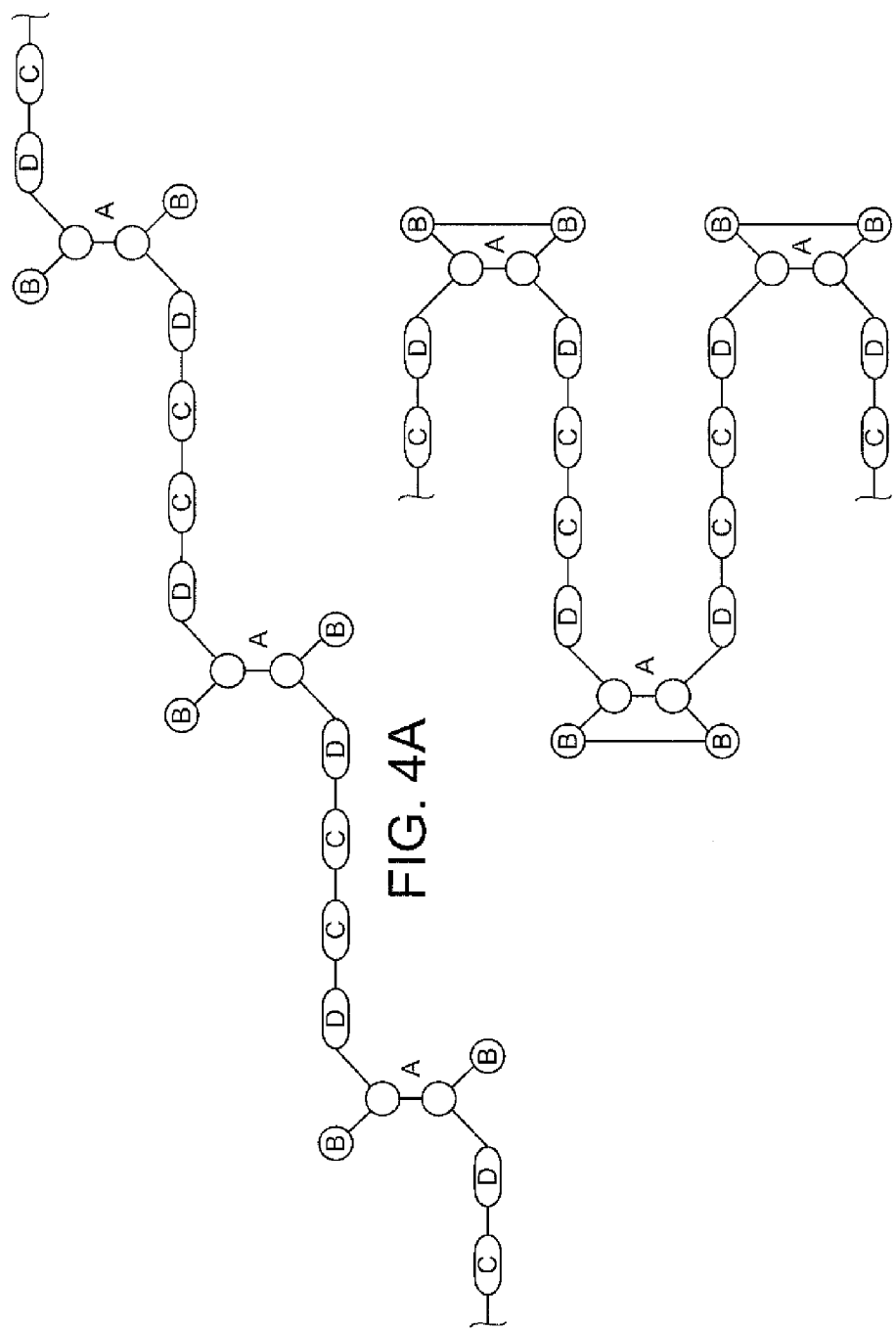

DEFORMABLE MATERIAL AND ACTUATOR

BACKGROUND

1. Technical Field

The present invention relates to a deformable material and an actuator.

2. Related Art

Recently, in the medical field, micromachine field, etc., the necessity of compact actuators grows.

Such compact actuators are required to be small and also be driven at a low voltage. Various attempts have been made to realize such actuators driven at a low voltage (see, for example, JP-A-2005-224027).

However, in the actuators in the related art, the driving voltage cannot be sufficiently decreased, and a high voltage is required for deforming the actuators. Further, in the actuators in the related art, it is difficult to obtain a sufficiently large deformation amount (displacement amount).

SUMMARY

An advantage of some aspects of the invention is to provide a deformable material which can be largely displaced at a low voltage and an actuator using the same.

An aspect of the invention is directed to a deformable material containing a stimulus-responsive compound whose molecular structure is changed according to an oxidation-reduction reaction and an electronically conductive substance, wherein the stimulus-responsive compound is a polymer obtained by polymerizing a constituent unit having a polymerizable functional group.

According to this, a deformable material which can be largely displaced at a low voltage can be provided.

It is preferable that the deformable material according to the aspect of the invention is in the form of a gel.

According to this, a deformable material which operates more flexibly can be obtained. Further, the stability of the shape and the handleability of the deformable material as a whole are particularly enhanced.

It is preferable that in the deformable material according to the aspect of the invention, the electronically conductive substance contains a carbon material.

According to this, the function of transporting electrons is improved, and the whole deformable material can be largely displaced at a relatively low voltage.

It is preferable that in the deformable material according to the aspect of the invention, the electronically conductive substance is in the form of particles.

According to this, the electronically conductive substance can be uniformly dispersed in the whole deformable material, and electrons can be favorably transported in the deformable material.

It is preferable that in the deformable material according to the aspect of the invention, the electronically conductive substance has an average particle diameter of 1 nm or more and 10 μm or less.

According to this, electrons can be favorably transported in the deformable material, and the efficiency of supplying electrons to the stimulus-responsive compound can be particularly enhanced.

It is preferable that in the deformable material according to the aspect of the invention, the polymerizable functional group is a vinyl group or a (meth)acrylic group.

According to this, the stimulus-responsive compound can be easily polymerized.

It is preferable that in the deformable material according to the aspect of the invention, the constituent unit contains a functional group having liquid crystallinity.

According to this, the response speed of the constituent unit can be more effectively improved, and the response speed of the stimulus-responsive compound (deformable material) obtained by polymerizing the constituent unit can be particularly increased. Further, displacement of the whole deformable material accompanying the expansion and contraction of the stimulus-responsive compound composed of the constituent unit can be more favorably amplified.

It is preferable that in the deformable material according to the aspect of the invention, the constituent unit has a structure in which the functional group having liquid crystallinity and the polymerizable functional group are disposed through a linking group.

According to this, when the groups having liquid crystallinity are oriented, the respective groups having liquid crystallinity can be prevented from becoming obstacles to one another. As a result, the motion performance when the groups having liquid crystallinity are oriented can be further enhanced, and therefore, the motion speed of the stimulus-responsive compound obtained by polymerizing the constituent unit is further increased.

It is preferable that in the deformable material according to the aspect of the invention, the constituent unit contains: a unit A having a bond which functions as a rotation axis; a first unit B which is disposed at a first bonding site of the unit A; a second unit B which is disposed at a second bonding site of the unit A; a first unit C; and a second unit C, wherein the first unit B and the second unit B are bonded to each other by a reduction reaction, and the first unit C and the second unit C each have the polymerizable functional group.

According to this, the response speed and the displacement amount of the stimulus-responsive compound obtained by polymerizing the constituent unit can be particularly increased. As a result, a larger displacement amount can be obtained in the deformable material as a whole.

It is preferable that in the deformable material according to the aspect of the invention, the unit A is at least one group selected from the group consisting of groups represented by the following formula (1), (2), or (3).

(1)

(2)

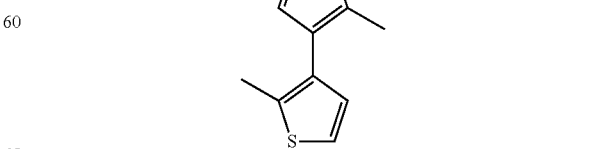

-continued

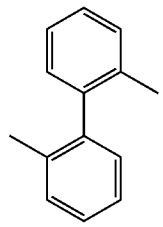
(3)

According to this, the stimulus-responsive compound can be more smoothly deformed (displaced), and the deformable material is driven at a lower voltage.

It is preferable that in the deformable material according to the aspect of the invention, the first unit B and the second unit B are each a group represented by the following formula (4).

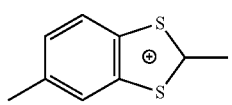
(4)

According to this, by adjusting the reaction conditions, the state of bonding between the first unit B and the second unit B can be reversibly and more easily switched from the bonding state to the non-bonding state. Further, due to high reactivity, the stimulus-responsive compound can be deformed more smoothly at a lower voltage.

It is preferable that in the deformable material according to the aspect of the invention, the first unit C and the second unit C each have the functional group having liquid crystallinity.

According to this, the response speed of the stimulus-responsive compound (deformable material) can be more effectively improved. Further, displacement of the whole deformable material accompanying the expansion and contraction of the stimulus-responsive compound can be more favorably amplified, and the displacement amount of the deformable material as a whole can be particularly increased. Further, the deformable material can be deformed at a lower voltage.

It is preferable that the deformable material according to the aspect of the invention further contains at least one member selected from the group consisting of a vinylidene fluoride-propylene hexafluoride copolymer, methyl poly(meth)acrylate, and an organic electrolyte oligomer.

According to this, the whole deformable material can be more favorably gelatinized. Further, the deformable material can be made to operate more flexibly. Further, in the case of the deformable material in a gel state, the ability to retain a solvent (a liquid component) can be particularly enhanced, and therefore, an undesirable decrease in volume of the deformable material over time can be more effectively prevented.

Another aspect of the invention is directed to an actuator, which is produced using the deformable material according to the aspect of the invention.

According to this, an actuator which can be largely displaced at a low voltage can be provided.

Still another aspect of the invention is directed to an actuator, including a deformable material layer containing the deformable material according to the aspect of the invention, a counter electrode, and an electrolytic solution which is interposed between the deformable material layer and the counter electrode.

According to this, an actuator which can be largely displaced at a low voltage can be provided.

BRIEF DESCRIPTION OF THE DRAWINGS

Embodiments of the invention will be described with reference to the accompanying drawings, wherein like numbers reference like elements.

FIGS. 4A and 4B are views for illustrating the molecular structures of a stimulus-responsive compound constituting a deformable material of the embodiment of the invention before and after an oxidation-reduction reaction.

DESCRIPTION OF EXEMPLARY EMBODIMENTS

Hereinafter, preferable embodiments of the invention will be described in detail.

Deformable Material

First, a preferable embodiment of the deformable material of the invention will be described in detail.

The deformable material of the embodiment of the invention mainly contains a stimulus-responsive compound and an electronically conductive substance. The deformable material may further contain a solvent, an electrolyte, a liquid crystalline polymer, and the like. The deformable material may further contain at least one member selected from the group consisting of a vinylidene fluoride-propylene hexafluoride copolymer, methyl poly(meth)acrylate, and an organic electrolyte oligomer.

The whole deformable material is preferably in the form of a gel (semi-solid). According to this, the handleability (ease of handling) of the deformable material is enhanced and also the range of application of the deformable material can be expanded. Further, the deformable material can be favorably used in the production of an actuator which operates flexibly. The form of the whole deformable material may be other form such as a solid or a liquid.

Hereinafter, the respective components constituting the deformable material of the embodiment of the invention will be described in detail.

Stimulus-Responsive Compound

First, the stimulus-responsive compound will be described.

Figure 2A:
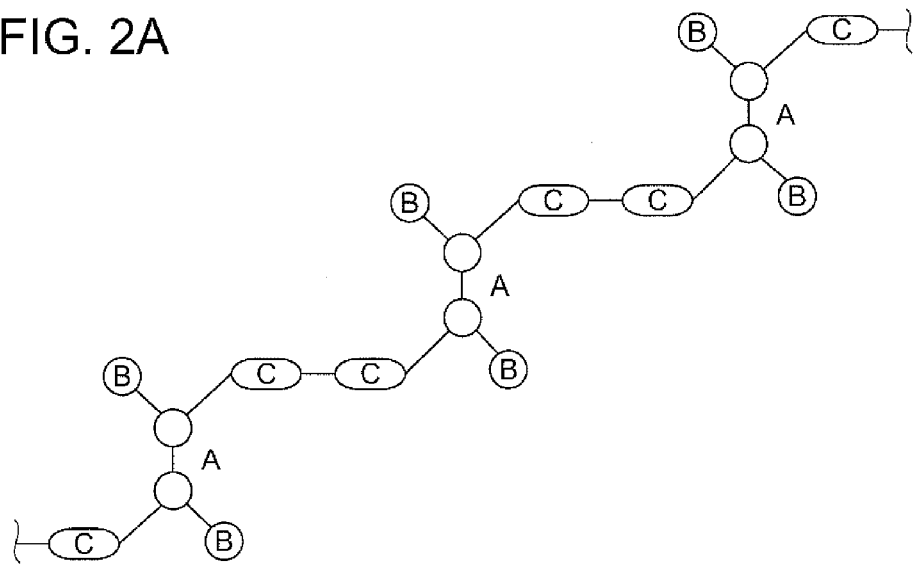
FIGS. 2A and 2B are views for illustrating the molecular structures of a stimulus-responsive compound constituting a deformable material of the embodiment of invention before and after an oxidation-reduction reaction.
Figure 2B:
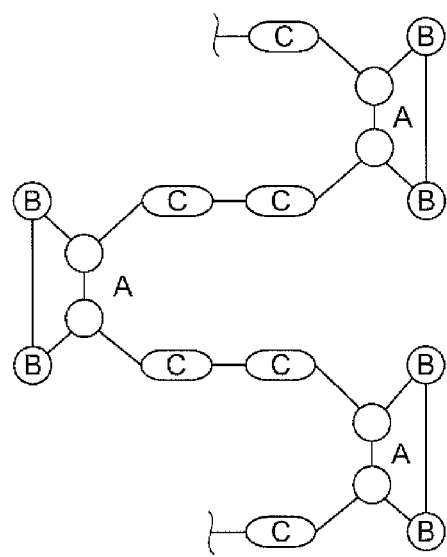
Figure 3A:
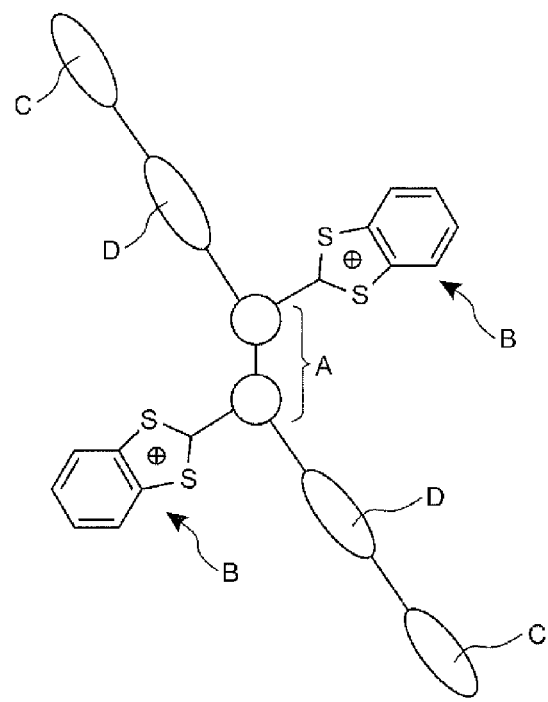
FIGS. 3A and 3B are views for illustrating the structures of a constituent unit of a stimulus-responsive compound constituting a deformable material of the embodiment of the invention before and after an oxidation-reduction reaction.
Figure 3B:
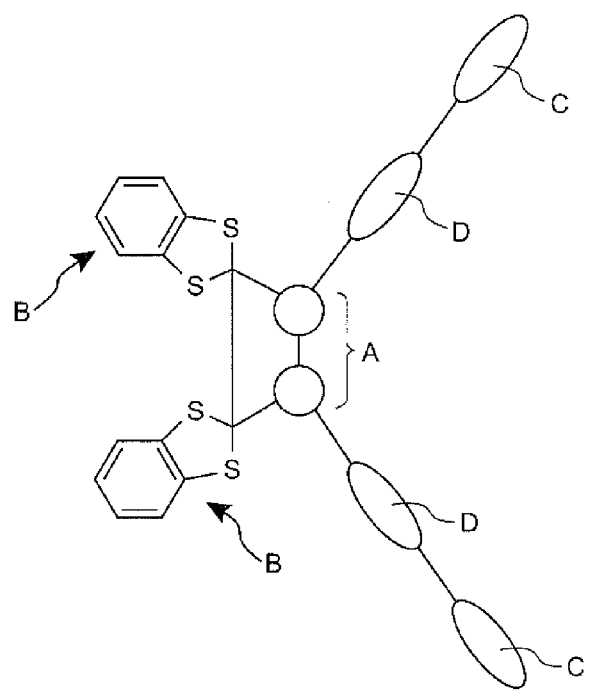

FIGS. 1A, 1B, 3A, and 33 are views for illustrating the structures of the constituent unit of the stimulus-responsive compound constituting the deformable material of the embodiment of the invention before and after an oxidation-reduction reaction. FIGS. 2A, 2B, 4A, and 4B are views for illustrating the molecular structures of the stimulus-responsive compound constituting the deformable material of the embodiment of the invention before and after an oxidation-reduction reaction. FIGS. 1A, 1B, 2A, and 2B show the stimulus-responsive compound which does not have a unit D described in detail below, and FIGS. 3A, 3B, 4A, and 4B show the stimulus-responsive compound which has a unit D described in detail below. FIGS. 3A and 3B correspond to FIGS. 1A and 1B, and FIGS. 4A and 4B correspond to FIGS. 2A and 23. In FIGS. 1A, 1B, 2A, 2B, 3A, 3B, 4A, and 4B, each open circle indicates a functional group (atomic group), and each line indicates a bond.

The stimulus-responsive compound is a compound which has a function of deforming (displacing) the molecular conformation by stimulation, in other words, a function of expanding and contracting the molecular chain.

In the embodiments of the invention, the stimulus-responsive compound changes its molecular conformation according to an oxidation-reduction reaction, and is a polymer obtained by polymerizing a constituent unit having a polymerizable functional group. This compound can largely displace the whole deformable material at a relatively low voltage. As a result, for example, in the case where the deformable material is applied to an actuator, a sufficiently large displacement force and displacement amount can be obtained at a low voltage. Further, the response speed of the deformable material can be increased, and also reproducibility of the deformation is excellent. Further, it is possible to reduce the weight of the deformable material and the weight of the actuator produced using the deformable material.

Constituent Unit

The constituent unit which constitutes the stimulus-responsive compound changes its molecular conformation according to an oxidation-reduction reaction, and has a function of expanding and contracting the molecular chain. According to this, the degree (ratio of change) of deformation of the shape of the stimulus-responsive compound as a polymer obtained by polymerizing the constituent unit can be increased.

Figure 1A:
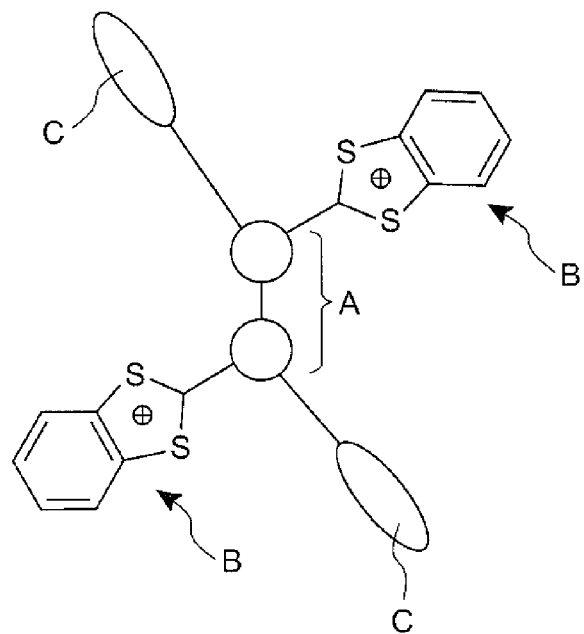
FIGS. 1A and 1B are views for illustrating the structures of a constituent unit of a stimulus-responsive compound constituting a deformable material of an embodiment of the invention before and after an oxidation-reduction reaction.

The constituent unit shown in FIG. 1A or the like has: a unit A having a bond which functions as a rotation axis; two units B (a first unit B and a second unit B) which are bonded to both ends (a first binding site and a second binding site) of the unit A; and two units C (a first unit C and a second unit C), and the first unit B and the second unit B are bonded to each other by a reduction reaction, and the first unit C and the second unit C each have a polymerizable functional group. According to this, the response speed and the displacement amount of the stimulus-responsive compound composed of the constituent unit can be particularly increased. As a result, a larger displacement amount can be obtained in the deformable material as a whole.

Figure 1B:
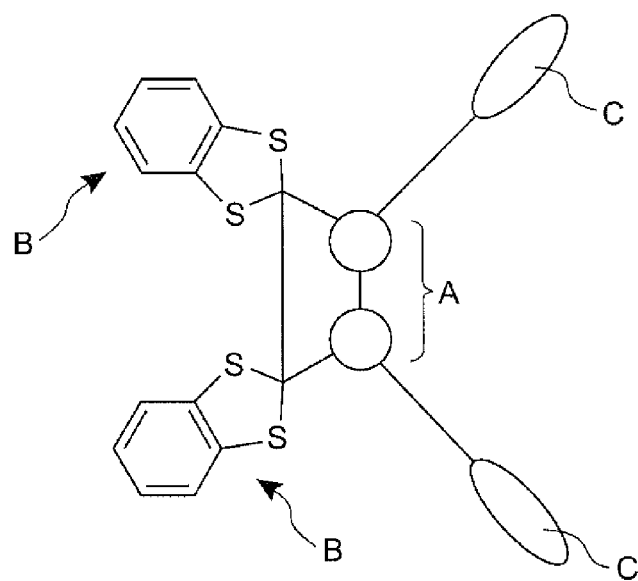

Hereinafter, the constituent unit as shown in FIGS. 1A and 1B is mainly described.

The unit A constituting the constituent unit is a group (unit) which has a bond functioning as a rotation axis and can rotate using the bond as an axis. Because of having such a unit, the constituent unit can be deformed (displaced).

As the unit A, for example, a group in which two aromatic rings are bonded to each other can be used, however, in particular, one type of group selected from the group consisting of groups represented by the following formula (1), (2), or (3) is preferable. According to this, the constituent unit can be more smoothly deformed (displaced), and as a result, the deformable material is driven at a lower voltage.

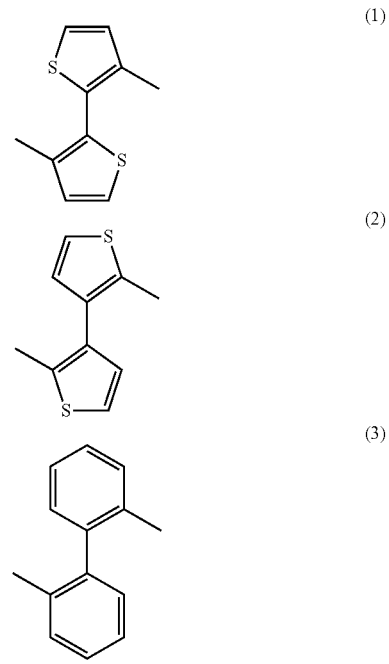

As shown in FIG. 1A, the units B (the first unit B and the second unit B) are groups which are bonded to both ends of the unit A (a first bonding site and a second bonding site of the unit A) in the direction of the rotation axis of the unit A. That is, the first unit B is bonded to the first bonding site of the unit A and the second unit B is bonded to the second bonding site of the unit A.

The units B are groups which are bonded to each other to form a bond according to an oxidation-reduction reaction (see FIG. 1B). In other words, the units B are groups which form a bond by receiving an electron from outside (by being reduced) and dissociate the bond by releasing an electron outside (by being oxidized). Such an oxidation-reduction reaction can be allowed to proceed by, for example, applying a voltage. Further, by stopping the application of the voltage, the oxidation-reduction reaction of the constituent unit can be stopped, and as a result, it becomes possible to maintain the shape of the deformable material.

The units B (the first unit B and the second unit B) are not particularly limited as long as the units B (the first unit B and the second unit B) are groups which are bonded to each other to form a bond according to an oxidation-reduction reaction, but are preferably groups represented by the following formula (4). According to this, by adjusting the reaction conditions, the state of bonding between the units B can be reversibly and more easily switched from the bonding state to the non-bonding state. Further, due to high reactivity, the constituent unit can be deformed more smoothly at a lower voltage.

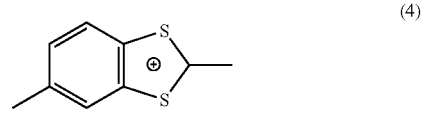

The units C (the first unit C and the second unit C) each have a polymerizable functional group. By polymerizing the constituent unit by means of this polymerizable functional group, the stimulus-responsive compound having a longer molecular chain can be formed. Further, by extending the molecular chain in such a manner, as described in detail below, the degree of deformation (displacement) of the molecule can be increased, and it becomes possible to perform driving by a stronger force (stress).

The polymerizable functional group of the units C (the first unit C and the second unit C) is preferably a vinyl group or a (meth)acrylic group. According to this, the stimulus-responsive compound can be easily polymerized.

The units C (the first unit C and the second unit C) preferably have a group having liquid crystallinity. According to this, when an electric field or a magnetic field is applied to the units C, the units C are oriented in a predetermined direction. As a result, the constituent unit exhibits a predetermined orientation with respect to the driving. The "liquid crystallinity" as used herein refers to a property in which the molecular orientation direction can be changed by applying an electric field or a magnetic field.

Since the units C (the first unit C and the second unit C) have a group having liquid crystallinity, displacement of the whole deformable material accompanying the expansion and contraction of the stimulus-responsive compound obtained by polymerizing the constituent unit can be more favorably amplified, and the displacement amount of the deformable material as a whole can be particularly increased. Further, it becomes possible to deform the deformable material at a lower voltage.

As the units C (the first unit C and the second unit C), in the case where a group having liquid crystallinity is contained, a group having a plurality of ring structures such as a group in which a plurality of aromatic rings (such as phenyl groups) are linked to one another through an ester group, a group in which a plurality of aromatic rings (such as benzene rings) or cyclohexane rings are directly linked to one another can be exemplified. Further, the group having a plurality of ring structures preferably contains two or more aromatic rings.

It is particularly preferable to use groups in which one or more halogen atoms are bonded to one of the ring structures as the units C. According to this, the motion performance when the units C are oriented can be further enhanced, and therefore, the motion speed is further increased. As a result, it becomes possible to deform (displace) the deformable material faster and more smoothly, and further, the deformable material is driven at a low voltage.

In the case where the constituent unit has a functional group having liquid crystallinity, it is preferable that the functional group having liquid crystallinity and the polymerizable functional group are disposed through a linking group. According to this, when the groups having liquid crystallinity are oriented, the respective groups having liquid crystallinity can be prevented from becoming obstacles to one another to cause a difficulty in orienting the groups. Further, the motion performance when the units C having a group having liquid crystallinity are oriented can be further enhanced, and therefore, the motion speed of the stimulus-responsive compound obtained by polymerizing the constituent unit is further increased. Further, the deformable material can be deformed (displaced) faster and more smoothly.

As the linking group which connects the functional group having liquid crystallinity to the polymerizable functional group, a group represented by $C_nH_{2n}$ or $C_nH_{2n}O$ (wherein n represents an integer of 1 or more) can be exemplified. In this case, n may be an integer of 1 or more, but is preferably an integer of 2 to 10. According to this, the motion performance when the units C having a group having liquid crystallinity are oriented can be particularly enhanced, and therefore, the motion speed of the stimulus-responsive compound obtained by polymerizing the constituent unit is particularly increased.

Specific examples of the units C (the first unit C and the second unit C) having a polymerizable functional group, a group having liquid crystallinity, and a linking group which connects the functional group having liquid crystallinity to the polymerizable functional group as described above include the following groups.

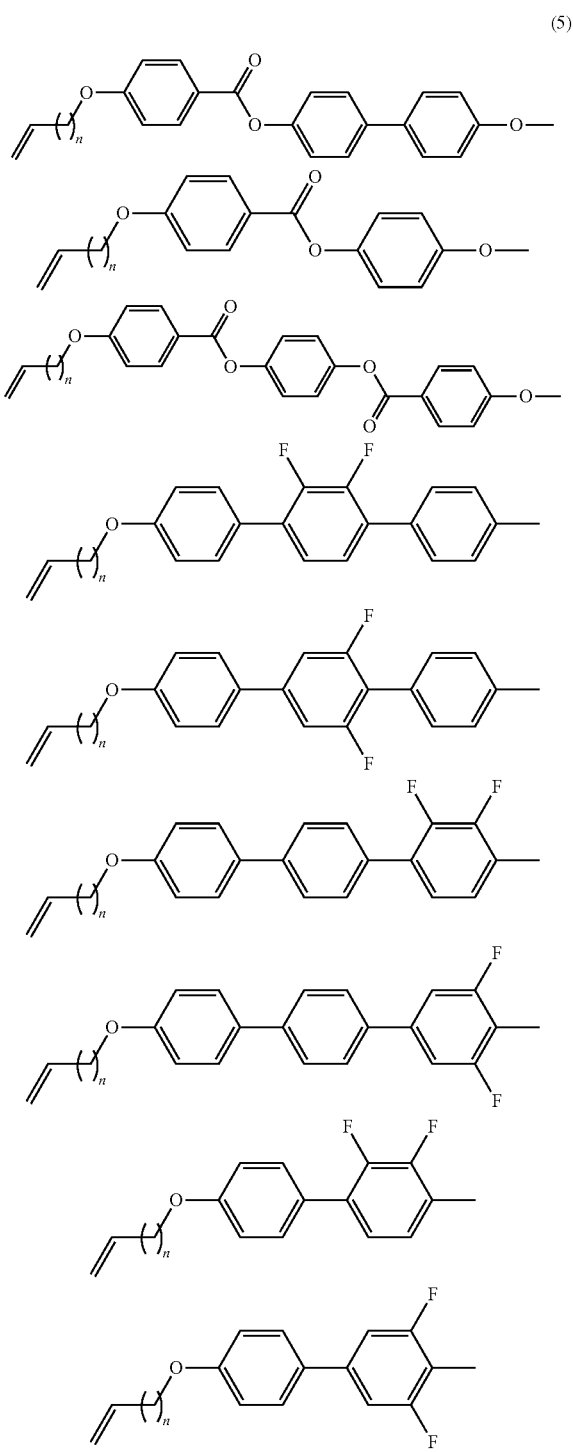

(5)

-continued

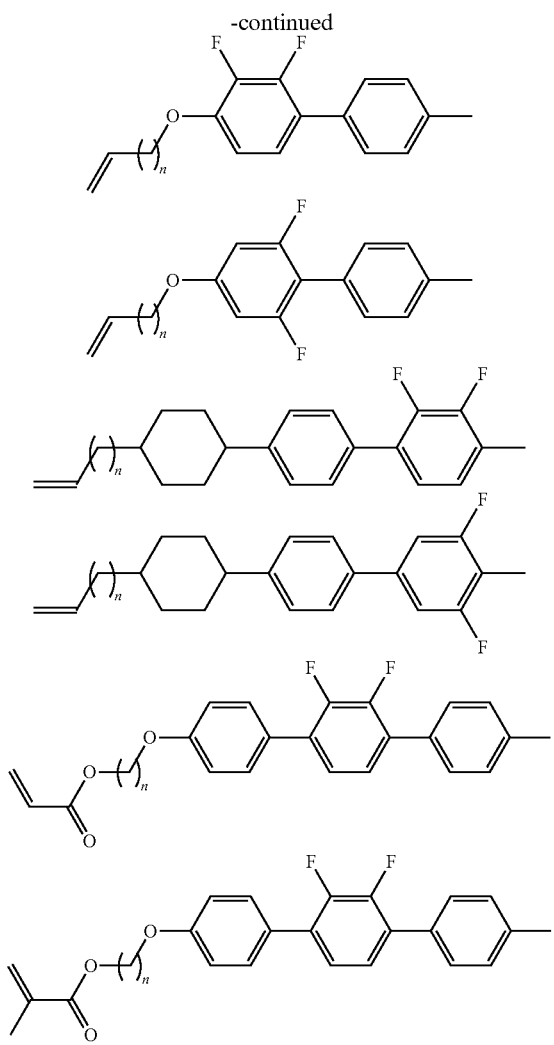

The unit C may be bonded to any site in the molecule of the constituent unit, and for example, may be bonded to the unit B, but is preferably bonded to the unit A. In particular, in the case where two units C (a first unit C and a second unit C) are contained in the molecule, it is preferable that the first unit C is disposed at a third bonding site (a site different from the first and second bonding sites) of the unit A and the second unit C is disposed at a forth bonding site (a site different from the first, second, and third bonding sites) of the unit A. According to this, the displacement amount of the constituent unit can be further increased. Further, by disposing the units C at such bonding sites, synthesis can be relatively easily performed.

As described above, in the case where the constituent unit has a unit A which can be axially rotated, units B (a first unit B and a second unit B) which are two units bonded to both ends (a first bonding site and a second bonding site) of the unit A and can be bonded to each other to form a bond according to an oxidation-reduction reaction, and units C (a first unit C and a second unit C) which are two units bonded to the unit A (a third bonding site and a forth bonding site) and have liquid crystallinity, the deformable material can be deformed (displaced) by a lower electric power, and also the degree of displacement can be relatively increased. The reason for this is considered to be as follows.

That is, due to the units C having liquid crystallinity, the plurality of constituent units can exist in an oriented (aligned) state, and when a voltage or the like is applied in such an oriented state, the units B in one molecule are bonded (crosslinked) to each other according to an oxidation-reduction reaction. In this manner, by utilizing the orientation (liquid crystallinity) of the units C and the bondability of the units B by stimulation, the stimulus-responsive compound can be reliably deformed (displaced) from the state shown in FIG. 1A to the state shown in FIG. 1B. In particular, since the orientation of the units C and the bonding of the units B proceed at a low voltage, it is possible to achieve large deformation (displacement) at a low voltage.

The constituent unit may further contain a unit D having a polyalkylene oxide structure obtained by polymerizing an alkylene oxide having 2 or 3 carbon atoms in the molecule other than the unit A, the units B (the first unit B and the second unit B), and the units C (the first unit C and the second unit C) described above (see FIGS. 3A, 3B, 4A, and 4B). According to this, the deformation can be favorably achieved at a lower voltage. Further, the flexibility of the deformable material can be further enhanced. Further, crystallization of the deformable material containing the stimulus-responsive compound obtained by polymerizing the constituent unit can be reliably prevented even at a low temperature, and therefore, the operability in a low temperature range (for example −10° C. or lower) can be particularly enhanced. In addition, if the constituent unit contains the unit D, the affinity and compatibility of the stimulus-responsive compound as a whole with a salt (an electrolyte) can be enhanced, and therefore, charge transfer during an oxidation-reduction reaction is achieved faster. As a result, the response speed of the deformable material is further increased.

If the constituent unit having a polyalkylene oxide structure contains the unit D, the ability to retain a solvent (liquid retention capability) of the stimulus-responsive compound as a whole can be particularly enhanced. Therefore, the whole deformable material can be more favorably gelatinized. Further, the deformable material can be made to operate more flexibly.

In the constituent unit, one unit D may be contained in the molecule, however, in the structure shown in FIGS. 3A and 3B, as the unit D, a first unit D and a second unit D are contained. According to this, the deformation can be favorably achieved at a lower voltage. Further, the flexibility of the deformable material and the operability thereof in a low temperature range can be further enhanced.

The unit D may be bonded to any site in the molecule of the constituent unit, and for example, may be bonded to the unit B, but is preferably bonded to the unit A. In particular, in the case where two units D (a first unit D and a second unit D) are contained in the molecule, it is preferable that the first unit D is disposed at a third bonding site (a site different from the first and second bonding sites) of the unit A and the second unit D is disposed at a forth bonding site (a site different from the first, second, and third bonding sites) of the unit A. According to this, the deformation can be favorably achieved at a lower voltage. Further, the flexibility of the deformable material and the operability thereof in a low temperature range can be further enhanced.

It is preferable that the first unit D is bonded to the first unit C, and the second unit D is bonded to the second unit C. According to this, the deformation can be favorably achieved at a lower voltage. Further, the flexibility of the deformable material and the operability thereof in a low temperature range can be further enhanced.

As described above, the units D (the first unit D and the second unit D) each have a polyalkylene oxide structure obtained by polymerizing an alkylene oxide having 2 or 3 carbon atoms.

In the case where the unit D has a structure in which an alkylene oxide having 2 carbon atoms (ethylene oxide) is polymerized, the flexibility of the deformable material and the operability thereof in a low temperature range and so on can be particularly enhanced. Further, the response speed of the deformable material can be particularly increased.

Meanwhile, in the case where the unit D has a structure in which an alkylene oxide having 3 carbon atoms (propylene oxide) is polymerized, the durability of the deformable material and the actuator can be particularly enhanced.

The number of the polymerized alkylene oxide molecules (the number of molecules of the alkylene oxide to be used as a starting material) in the units D (the first unit D and the second unit D) is preferably 4 or more and 20 or less, and more preferably 5 or more and 10 or less. As a result, the durability of the deformable material and the actuator can be sufficiently enhanced, and also the flexibility of the deformable material and the operability thereof in a low temperature range and so on can be particularly enhanced, and therefore, the response speed of the deformable material can be particularly increased.

Stimulus-Responsive Compound

The stimulus-responsive compound is a polymer obtained by polymerizing the constituent unit as described above.

The constituent unit as described above contains the units C (the first unit C and the second unit C) each having a polymerizable functional group, and therefore, by polymerizing the constituent unit by means of the polymerizable functional group, the stimulus-responsive compound which is a polymer obtained by polymerizing the constituent unit can be obtained. According to this, the degree of deformation (displacement) of the molecule of the stimulus-responsive compound can be increased, and as a result, a larger displacement amount can be obtained in the deformable material as a whole.

That is, the stimulus-responsive compound which is a polymer obtained by polymerizing the constituent unit by means of the polymerizable functional group of the unit C is in a state where the constituent units are connected in series as the structures shown in FIGS. 2A and 2B. In the case where the stimulus-responsive compound is in an oxidized state, as shown in FIG. 2A, the constituent units exist in an extended state where the constituent units are connected to one another in a longitudinal direction. According to this, the molecular conformation is in an extended (expanded) state. In the case where the stimulus-responsive compound is in a reduced state, as shown in FIG. 2B, the constituent unit rotates by using the unit A as an axis and is transformed into a state where the adjacent units B are bonded to each other by a reduction reaction, and further the units C having liquid crystallinity are oriented to form a folded structure by using the units B as base points. In this manner, the molecular conformation is transformed into a contracted state. As described above, the molecular conformation of the stimulus-responsive compound as a whole is significantly changed. The stimulus-responsive compound obtained by polymerizing the constituent unit having the units B has the plurality of units B to be used as the base points of folding. Therefore, the degree of displacement of the stimulus-responsive compound as a whole can be increased.

Further, by applying a voltage to the stimulus-responsive compound, the units C having a functional group having liquid crystallinity are oriented in a predetermined direction. Therefore, due to the synergistic effect of the existence of the plurality of units B to be used as the base points of folding as described above and the orientation of the units C of the respective constituent units, the degree of displacement of the stimulus-responsive compound as a whole can be further increased.

In addition, the above-described change in molecular conformation is reversible, and the molecule in a contracted state can return to an extended (expanded) state as described above. Further, the molecule can be subjected to this change in molecular conformation a plurality of times, and also the reproducibility of the expansion and contraction is excellent.

The stimulus-responsive compound as described above changes its molecular conformation and has the reversibility and reproducibility of the molecular conformation change. Therefore, the deformable material containing the stimulus-responsive compound also has the same effects. As a result, in the whole deformable material, the degree (ratio of change) of deformation can be increased, and also orientation can be given to the deformation. In addition, by stopping the application of a voltage, the shape of the deformable material can be maintained. As a result, such a deformable material can be preferably used in the production of an excellent actuator.

In the case where the whole deformable material containing the stimulus-responsive compound is in the form of a gel, there are a deformable material in which the stimulus-responsive compound obtained by polymerizing the constituent unit is in the form of a gel per se (including one in which the stimulus-responsive compound is in the form of a gel alone and one in which the stimulus-responsive compound is transformed into the form of a gel by adding a solvent thereto (hereinafter the same shall apply)) and the whole deformable material is in the form of a gel, and a deformable material in which the whole deformable material is gelatinized by additionally adding a gelling agent thereto.

The stimulus-responsive compound which is obtained by polymerizing the constituent unit and is in the form of a gel per se can gelatinize the deformable material by incorporating a solvent in the stimulus-responsive compound. Further, by doing this, the deformable material can more favorably achieve anisotropic expansion and contraction. Further, the deformable material has more favorable elasticity. In addition, in the case where the stimulus-responsive compound is a polymer obtained by polymerizing the constituent unit having the unit D having a polyalkylene oxide structure, the ability to retain a solvent (liquid retention capability) of the stimulus-responsive compound as a whole can be particularly enhanced. As a result, the deformable material can be gelatinized, and the stability of the shape and the handleability of the deformable material as a whole are particularly enhanced.

The stimulus-responsive compound may be composed only of a polymer obtained by polymerizing the constituent unit as described above, but may be configured such that another constituent component is contained in the polymer. For example, the polymer as described above may be further chemically modified partially, and a substituent may be introduced therein. According to this, for example, the response speed of the stimulus-responsive compound as a whole can be further improved. In addition, for example, the ability to retain a solvent (liquid retention capability) of the stimulus-responsive compound as a whole can be particularly enhanced.

The weight average molecular weight (Mw) of the stimulus-responsive compound is preferably 1,000 or more and 500,000 or less, more preferably 10,000 or more and 100,000 or less. According to this, the effect of the embodiments of the invention of the incorporation of an electronically conductive substance as described in detail below as well as the stimulus-responsive compound as described above is more prominently exhibited.

The content of the stimulus-responsive compound in the deformable material is preferably 10% by mass or more and 80% by mass or less, more preferably 20% by mass or more and 60% by mass or less. According to this, the effect of the embodiments of the invention of the incorporation of an electronically conductive substance as described in detail below as well as the stimulus-responsive compound as described above is more prominently exhibited.

Electronically Conductive Substance

The deformable material of the embodiment of the invention contains, in addition to the stimulus-responsive compound as described above, an electronically conductive substance having a function of transporting electrons in the deformable material.

Examples of the electronically conductive substance include metal materials, carbon materials, compounds thereof, and organic materials. Specific examples thereof include various types of carbon materials such as graphite, carbon nanotubes, graphen, carbon nanoparticles, acetylene black, and active carbon; electroconductive polymers such as polyaniline, polythiol, polypyrrole, Si-based semiconductor materials, Ga-based semiconductor materials, and PEDOT: PSS (poly(3,4-ethylenedioxythiophene):poly(styrene-sulfonate)); transparent electroconductive oxide materials (such as ITO (indium tin oxide)); and various types of metal nanowires. Among these, particularly carbon materials are preferable, and carbon nanoparticles are more preferable. According to this, high electronic conductivity can be imparted to the whole deformable material.

The form of the particles of the carbon material or the like is not particularly limited, and the particles may be in any form such as a dense, porous, or hollow form. Further, for example, in the case where carbon nanoparticles are used as the electronically conductive substance, it is preferable to use carbon nanoparticles having a hollow shell structure. Since electrons are transported only in a surface portion of the particles, by using carbon nanoparticles having a hollow shell structure, the function of transporting electrons can be further improved. Further, the whole deformable material can be largely displaced at a relatively low voltage.

In the case where carbon nanoparticles having a hollow shell structure are used as the electronically conductive substance, the porosity (void ratio) of the carbon nanoparticles is preferably 90% by volume or less, more preferably 30% by volume or more and 90% by volume or less, further more preferably 60% by volume or more and 90% by volume or less. According to this, the effect as described above can be more prominently exhibited while sufficiently maintaining the stability of the shape of the carbon nanoparticles (electronically conductive substance). As a result, the effect as described above can be exhibited stably over a long period of time, and also the uniformity of the properties of the deformable materials among lots, and the uniformity of the properties among individual products in the case where the deformable material is applied to an actuator or the like can be particularly enhanced.

The electronically conductive substance may be dissolved in the other component in the deformable material, but preferably exists as an insoluble component in the deformable material, and particularly more preferably exists in the form of a solid.

Examples of the form of the electronically conductive substance include various forms such as particles, plates, and fibers (such as tubes), but the electronically conductive substance is particularly preferably in the form of particles. The shape of the particles may be either a sphere or a non-sphere (such as a scale, a spindle, or a spheroid). According to this, the electronically conductive substance can be dispersed uniformly in the whole deformable material, and the whole deformable material can be largely displaced uniformly at a relatively low voltage.

In the case where the electronically conductive substance is in the form of particles, the average particle diameter thereof is preferably 1 nm or more and 10 μm or less, more preferably 2 nm or more and 90 nm or less. According to this, by adding the electronically conductive substance at a necessary concentration in the whole deformable material, supply of electrons can be reliably achieved in the deformable material. Further, the efficiency of supply of electrons to the stimulus-responsive compound can be particularly enhanced, and a larger displacement force and displacement amount can be obtained. On the other hand, if the average particle diameter thereof is less than the above-described lower limit, the electronically conductive substance is aggregated, and therefore, a treatment for preventing this aggregation is needed. Meanwhile if the average particle diameter thereof exceeds the above-described upper limit, it is necessary to increase the content of the electronically conductive substance, and a further improvement of the effect as described above is not observed.

The "average particle diameter" as used herein refers to an average particle diameter on the volume basis (volume average particle diameter ($D_{50}$)). As the measurement device, for example, a laser diffraction scattering particle size distribution analyzer, Microtrack MT-3000 (manufactured by Nikkiso Co., Ltd.) or the like can be used. The volume average particle diameters ($D_{50}$) in the below-described Examples are values measured by the above-described Microtrack MT-3000.

By the incorporation of the electronically conductive substance as described above, the whole deformable material can be largely displaced at a relatively low voltage. Further, the whole deformable material can be efficiently deformed. As a result, for example, when the deformable material is applied to an actuator, a sufficiently large displacement force and displacement amount can be obtained at a low voltage. Further, in the case where an actuator is produced using the deformable material of the embodiment of the invention, even if an electrode is not brought into contact with a large area of the deformable material (deformable material layer), the deformable material (deformable material layer) can be sufficiently largely displaced. As a result, the actuator can operate flexibly.

The content of the electronically conductive substance in the deformable material is preferably 10% by mass or more and 90% by mass or less, more preferably 30% by mass or more and 70% by mass or less. According to this, electrons in the deformable material can be favorably transported. On the other hand, if the content of the electronically conductive substance is less than the above-described lower limit, the function of assisting the transfer of electrons in the deformable material is decreased. Meanwhile, if the content of the electronically conductive substance exceeds the above-described upper limit, a further improvement of the effect as described above is not observed.

The dispersion state of the electronically conductive substance in the deformable material is preferably uniform, however, the deformable material may have a portion in which the concentration of the electronically conductive substance may continuously or discontinuously (intermittently) change. In the case where the dispersion state of the electronically conductive substance in the deformable material is uniform, the whole deformable material can be largely displaced uniformly at a relatively low voltage. In particular, even if the thickness of the deformable material is relatively large, the deformation thereof can be efficiently achieved.

Solvent

The deformable material of the embodiment of the invention may contain a solvent. When the solvent is incorporated in the above-described stimulus-responsive compound or the like, the deformable material is favorably gelatinized, and therefore, solidification can be easily achieved and also the handleability of the deformable material can be improved.

Examples of the solvent include organic solvents such as dimethyl sulfoxide (DMSO), toluene, benzene, dimethylformamide (DMF), dimethylacetamide (DMA), chloroform, dichloromethane, dichloroethane, acetone, propylene carbonate, methylpentanone, ethylpentanone, and acetonitrile.

The content of the solvent in the deformable material is preferably 20% by mass or more and 80% by mass or less, more preferably 30% by mass or more and 60% by mass or less. According to this, the handleability of the deformable material can be further enhanced.

Electrolyte

The deformable material of the embodiment of the invention may contain an electrolyte.

As the electrolyte, any of various types of acids, bases, and salts can be used, however, it is preferable to use a salt. According to this, the durability of the deformable material can be particularly enhanced. As the electrolyte salt, an inorganic salt such as lithium perchlorate, lithium hexafluorophosphate, or lithium trifluoromethanesulfonate; an organic salt such as tetrabutyl ammonium tetrafluoroborate, 1-butyl-1-methylpyrrolidinium bis(trifluoromethylsulfonyl)imide (BMPTFSI), methyl trioctyl ammonium bis(trifluoromethylsulfonyl)imide (MTOATFSI), triethylsulfonium bis(trifluoromethylsulfonyl)imide (TESTFSI), or 1-ethyl-3-methylimidazolium trifluoromethanesulfonate (EMICF$_3$SO$_3$); or the like can be used. The structural formulae of BMPTFSI, MTOATFSI, TESTFSI, and EMICF$_3$SO$_3$ are represented by the following formulae (6), (7), (8), and (9), respectively.

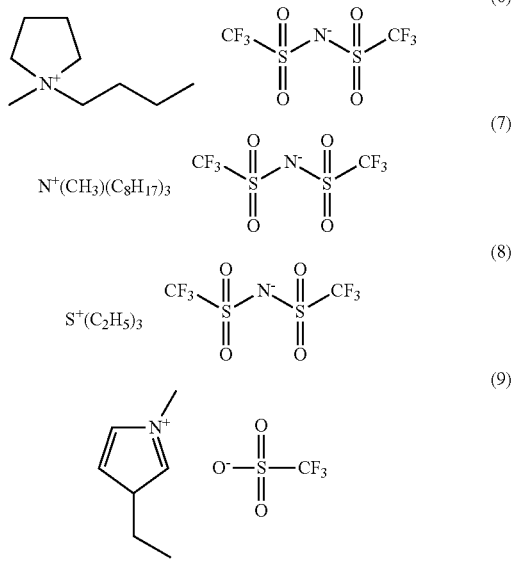

It is preferable that the deformable material contains at least one compound selected from the group consisting of lithium perchlorate, lithium trifluoromethanesulfonate, lithium hexafluorophosphate, and tetrabutyl ammonium tetrafluoroborate as the electrolyte. According to this, the response speed of the stimulus-responsive compound (deformable material) can be more effectively improved, and also the displacement of the whole deformable material accompanying the expansion and contraction of the stimulus-responsive compound can be further amplified.

By the incorporation of the electrolyte as described above, charge transfer to and from the stimulus-responsive compound can be allowed to more rapidly proceed, and the high-speed responsiveness of the deformable material can be particularly enhanced. In addition, in an actuator as described below, the stimulus-responsive compound constituting the deformable material layer can be efficiently expanded and contracted throughout the whole deformable material layer (in particular, the whole deformable material layer in the thickness direction). As a result, the ratio of expansion and contraction of the deformable material layer as a whole can be particularly increased.

In particular, in the case where the deformable material contains an electrolyte along with a solvent, the response speed of the stimulus-responsive compound (deformable material) can be more effectively improved and also the displacement of the whole deformable material accompanying the expansion and contraction of the stimulus-responsive compound can be further amplified.

The content of the electrolyte in the deformable material is preferably 3% by mass or more and 80% by mass or less, more preferably 5% by mass or more and 30% by mass or less. According to this, the effect as described above can be more prominently exhibited.

Gelling Agent

The deformable material of the embodiment of the invention may contain a gelling agent as a material capable of gelatinizing the whole deformable material. According to this, the whole deformable material can be more favorably gelatinized. In particular, even in the case where the stimulus-responsive compound is difficult to gelatinize, by incorporating the gelling agent, the whole deformable material can be favorably gelatinized. Further, the gelling agent can be used not only in the case where the stimulus-responsive compound is not in the form of a gel per se, but also in the case where the stimulus-responsive compound is in the form of a gel per se.

As the gelling agent constituting the deformable material, any of various types of materials such as a variety of resin materials, agar, gelatin, alginates, and gellan gum can be used, however, it is preferable that the deformable material of the embodiment of the invention contains at least one compound selected from the group consisting of a vinylidene fluoride-propylene hexafluoride copolymer, methyl poly(meth)acrylate, and an organic electrolyte oligomer. According to this, the whole deformable material can be more favorably gelatinized. Further, the deformable material can be made to operate more flexibly. In addition, in the deformable material in the form of a gel, an ability to retain the solvent (liquid component) can be particularly enhanced, and therefore, an undesirable decrease in volume of the deformable material over time can be more effectively prevented.

In particular, in the case where the deformable material of the embodiment of the invention contains a vinylidene fluoride-propylene hexafluoride copolymer, the deformable material can be made more flexible. Further, since the vinylidene fluoride-propylene hexafluoride copolymer is hydrophobic, undesirable absorption of water (particularly absorption of water during production) can be prevented, and swelling of the whole deformable material due to water can be prevented. As a result, the deformation amount of an actuator as described below can be more reliably adjusted. The weight average molecular weight (Mw) of the vinylidene fluoride-propylene hexafluoride copolymer is preferably 10,000 or more and 1,000,000 or less, more preferably 100,000 or more and 500,000 or less. According to this, the effect as described above is more prominently exhibited.

The chemical structure of the vinylidene fluoride-propylene hexafluoride copolymer can be represented by the following formula (10).

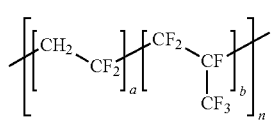
(10)

In the formula (10), a is preferably 0.60 or more and 0.98 or less, more preferably 0.75 or more and 0.95 or less. According to this, the deformable material can be made to have flexibility more suitable for deformation.

In the case where the deformable material of the embodiment of the invention contains methyl poly(meth)acrylate, cracking or the like can be more reliably prevented from occurring when the deformable material is deformed.

The weight average molecular weight (Mw) of methyl polymethacrylate is preferably 10,000 or more and 100,000 or less, more preferably 10,000 or more and 50,000 or less. According to this, the effect as described above is more prominently exhibited.

The chemical structure of methyl polymethacrylate can be represented by the following formula (11).

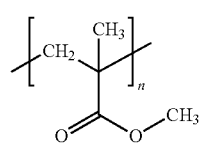
(11)

In the case where the deformable material of the embodiment of the invention contains an organic electrolyte oligomer, the organic electrolyte oligomer can also function as the above-described electrolyte.

As the organic electrolyte oligomer, for example, one represented by the following formula (12) can be used.

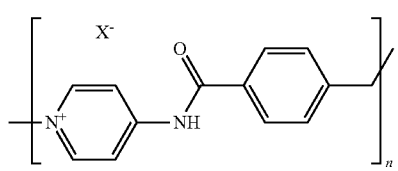
(12)

In the formula (12), X represents a halogen, $(CF_3SO_2)N$, $PF_6$, $BF_4$, SCN, or $CF_3SO_3$; and n represents a number of 3 or more and 30 or less.

The content of the gelling agent in the deformable material is preferably 5% by mass or more and 50% by mass or less. According to this, the effect as described above can be more prominently exhibited.

Liquid Crystalline Polymer

The deformable material of the embodiment of the invention may contain a liquid crystalline polymer.

As the liquid crystalline polymer, one having an assisting function to facilitate the molecular deformation by the change in conformation of the stimulus-responsive compound as described above is preferable. In particular, in the case where the deformable material contains a compound having a functional group having liquid crystallinity as the stimulus-responsive compound, by the incorporation of the liquid crystalline polymer, as the orientation of the functional group (unit C) having liquid crystallinity is changed according to the oxidation-reduction reaction of the stimulus-responsive compound, the orientation of the liquid crystalline polymer is also changed so as to facilitate the molecular deformation by the change in conformation of the stimulus-responsive compound as described above. According to this, the degree of deformation of the deformable material as a whole can be further increased, and the response speed can be made faster. That is, the deformable material has particularly excellent high-speed responsiveness and exhibits a larger degree of anisotropic expansion and contraction.

The liquid crystalline polymer can be obtained by polymerizing a monomer having a functional group having liquid crystallinity.

As the functional group having liquid crystallinity, a group having a plurality of ring structures, for example, a group in which a plurality of aromatic rings (such as phenyl groups) are linked to one another through an ester group and a group in which a plurality of aromatic rings (such as benzene rings) or cyclohexane rings are directly linked to one another can be exemplified.

As the monomer, for example, a monomer having a functional group having liquid crystallinity and an acrylic group and a monomer having a functional group having liquid crystallinity and a (meth)acrylic group, and the like can be exemplified.

Examples of such a monomer include compounds represented by the following formula (13) or (14).

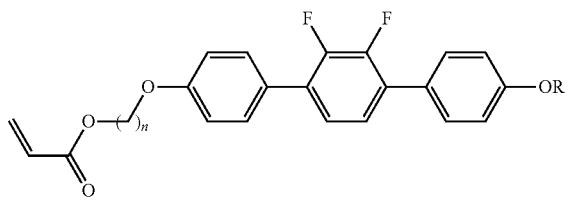
(13)

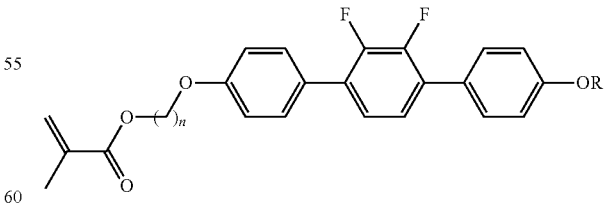
(14)

In the formulae (13) and (14), n represents an integer of 6 or more, and R represents an alkyl group having 1 or more carbon atoms.

By using such a monomer, the deformable material can be deformed (displaced) more rapidly and more smoothly, and can be driven at a lower voltage.

In the case where the deformable material contains a liquid crystalline polymer, the liquid crystalline polymer is preferably one obtained by crosslinking with a crosslinking agent. According to this, the deformable material can be favorably solidified (gelatinized). That is, by the incorporation of the liquid crystalline polymer having a crosslinked structure, the stimulus-responsive compound can be incorporated in the molecule of the liquid crystalline polymer, and the deformable material can be solidified (gelatinized). As a result, the stability of the shape and the handleability of the deformable material as a whole are particularly enhanced. Further, according to this, the anisotropic expansion and contraction of the deformable material can be more favorably achieved. In addition, because of having a crosslinked structure, the deformable material has more favorable elasticity.

The crosslinking agent is not particularly limited, and any crosslinking agent may be used as long as it can crosslink a polymer formed from the above-described monomer. However, by using a crosslinking agent represented by the following formula (15), the stimulus-responsive compound can be more easily incorporated in the molecule of the liquid crystalline polymer, and the deformable material can be more reliably solidified (gelatinized).

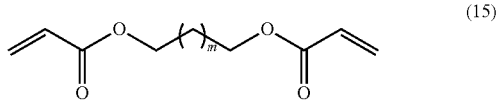

(15)

In the formula (15), m represents an integer of 4 or more.

Specific examples of the crosslinking agent include bisacryloyloxyhexane, N,N-methylenebisacrylamide, and ethylene glycol dimethacrylate.

The liquid crystalline polymer is preferably one obtained by adding the crosslinking agent in an amount of 1 mol or more and 10 mol or less with respect to 100 mol of the monomer having a functional group having liquid crystallinity to effect crosslinking. According to this, the displacement of the whole deformable material accompanying the expansion and contraction of the stimulus-responsive compound can be efficiently amplified.

In the case where the deformable material contains a compound having a functional group having liquid crystallinity as the stimulus-responsive compound, the liquid crystalline polymer is preferably one having the same functional group as the functional group having liquid crystallinity of the stimulus-responsive compound. According to this, the response speed of the stimulus-responsive compound (deformable material) can be more effectively improved. Further, the displacement of the whole deformable material accompanying the expansion and contraction of the stimulus-responsive compound can be more favorably amplified, and the displacement amount of the deformable material as a whole can be further increased. In addition, the deformable material can be deformed at a lower voltage.

The weight average molecular weight (Mw) of the liquid crystalline polymer is preferably 10,000 or more and 100,000 or less, more preferably 10,000 or more and 50,000 or less. According to this, the effect as described above is more prominently exhibited.

By using the liquid crystalline polymer as described above, the response speed of the deformable material as a whole can be effectively improved. Further, the displacement of the whole deformable material accompanying the expansion and contraction of the stimulus-responsive compound can be more favorably amplified, and the displacement amount of the deformable material as a whole can be particularly increased.

The content of the liquid crystalline polymer in the deformable material is preferably 3% by mass or more and 50% by mass or less. According to this, the effect as described above can be more prominently exhibited.

In the case where the deformable material of the embodiment of the invention contains a liquid crystalline polymer along with a gelling agent, the effect as described above is obtained, and also due to the synergistic action of these components, the strength of the deformable material can be further enhanced, and the displacement amount can be further increased.

The deformable material of the embodiment of the invention may contain a component other than the above-described components.

The electrical conductivity of the whole deformable material containing the electronically conductive substance etc. as described above is preferably 0.1 S/cm or more, more preferably 1 S/cm or more. According to this, the deformable material can be favorably applied to an actuator as described in detail below, and further, the size of the actuator can be reduced.

Actuator

Next, an actuator using the above-described deformable material of the embodiment of the invention (the deformable material containing the above-described stimulus-responsive compound, electronically conductive substance, etc.) will be described in detail.

Figure 5:
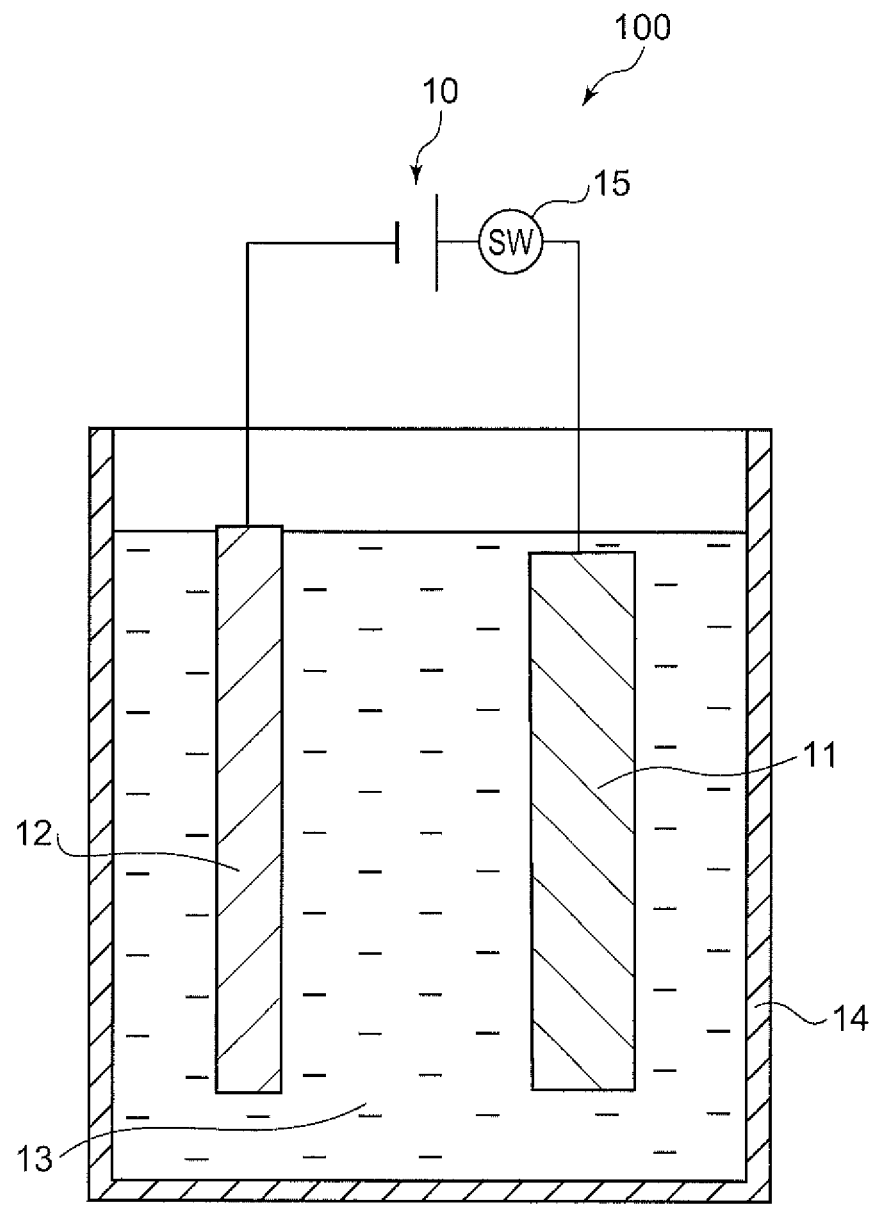
FIG. 5 is a cross-sectional view schematically showing one example of an actuator using a deformable material of the embodiment of the invention.
Figure 6:
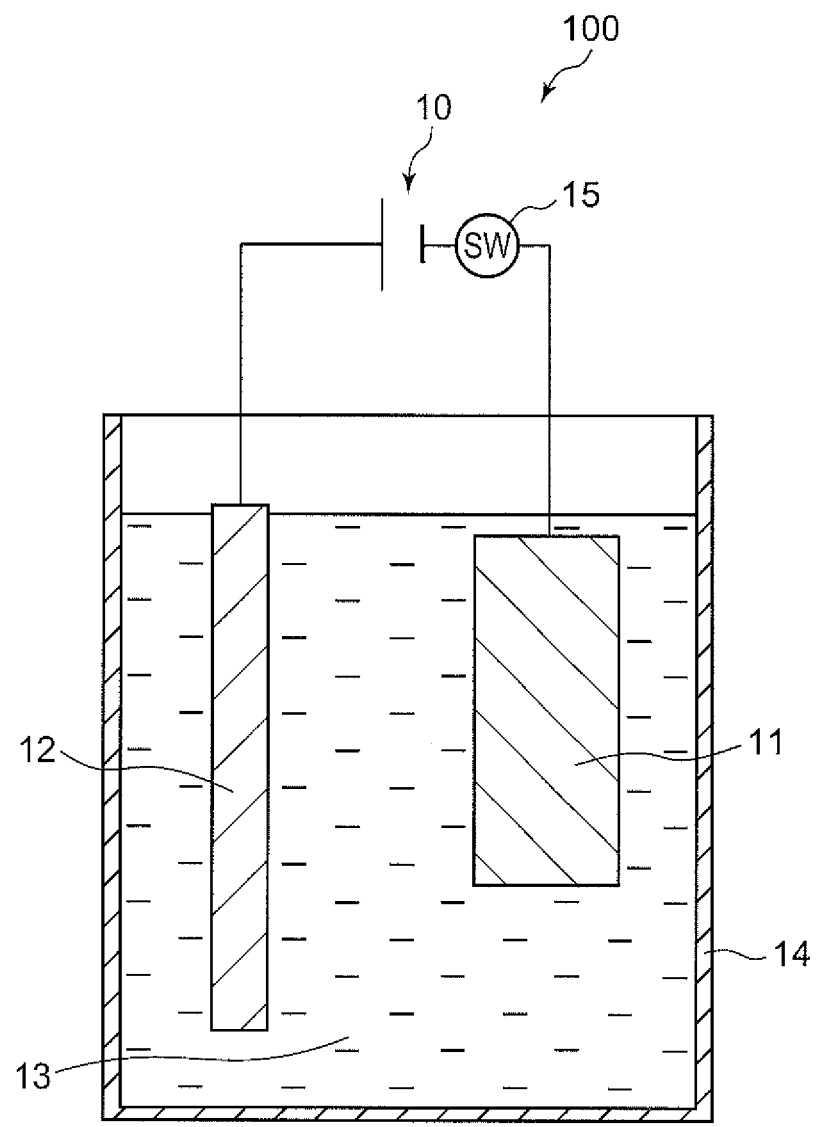
FIG. 6 is a cross-sectional view showing one example of an actuator deformed by applying a voltage.

FIG. 5 is a cross-sectional view schematically showing one example of an actuator using the deformable material of the embodiment of the invention, and FIG. 6 is a cross-sectional view showing one example of the actuator deformed (contracted) by applying a voltage.

The actuator of the embodiment of the invention is produced using the deformable material of the embodiment of the invention. According to this, an actuator which can be largely displaced at a low voltage can be provided.

In particular, as shown in FIG. 5, an actuator 100 of this embodiment is formed by using a switch 15 which turns on and off a power source 10 and the deformable material of the embodiment of the invention, and is provided with: a deformable material layer 11 which is connected to the power source 10; a counter electrode which is connected to the power source 10; an electrolytic solution 13 which is interposed between the deformable material layer 11 and the counter electrode 12; and a container 14. In the container 14, the electrolytic solution 13 is contained. The deformable material layer 11 and the counter electrode 12 are disposed facing each other spaced apart at a predetermined distance and are immersed in the electrolytic solution 13.

The power source 10 in a state shown in FIG. 5 is a DC power source, and the deformable material layer 11 is connected to the positive electrode of the power source 10 through the switch 15, and the counter electrode 12 is connected to the negative electrode of the power source 10. In the case where the stimulus-responsive compound constituting the deformable material layer 11 has a structure as shown in FIGS. 1A to 4B, when the switch 15 is turned on, an electric current flows between the deformable material layer 11 and the counter electrode 12, and the stimulus-responsive compound is transformed into a state where the molecular chain is extended (expanded) by an oxidation reaction. As a result, the deformable material layer 11 as a whole is transformed into an extended (expanded) state.

On the other hand, in a state shown in FIG. 6, the deformable material layer 11 is connected to the negative electrode of the power source 10 through the switch 15, and the counter electrode 12 is connected to the positive electrode of the power source 10. In the case where the stimulus-responsive compound constituting the deformable material layer 11 has a structure as shown in FIGS. 1A to 4B, when the switch 15 is turned on, an electric current flows between the deformable material layer 11 and the counter electrode 12, and the stimulus-responsive compound is transformed into a state where the molecular chain is contracted by a reduction reaction. As a result, the deformable material layer 11 as a whole is also transformed into a contracted state.

The deformable material layer 11 is formed of the above-described deformable material and functions as an electrode in the electrolytic solution 13, and is a layer which is deformed by applying a voltage thereto.

The form of the deformable material layer 11 is not particularly limited, and may be any of various forms such as a fiber, a sheet, a plate, and a rod. Further, the thickness of the deformable material layer 11 may be relatively large. Here, the thickness of the deformable material layer 11 is not particularly limited, but is preferably 0.01 mm or more and 10 mm or less, more preferably 0.05 mm or more and 2 mm or less. According to this, a larger displacement force can be obtained while decreasing the driving voltage to a relatively low level. Further, although the compact actuator of the related art has a problem that when the thickness of the deformable material layer 11 is increased, a displacement force and a displacement amount are drastically decreased, in the embodiments of the invention, even if the thickness of the deformable material layer 11 is relatively large as described above, the actuator can be favorably driven. That is, in the case where the thickness of the deformable material layer 11 is in the range described above, the effect of the embodiments of the invention is more prominently exhibited.

The counter electrode 12 is formed of a material having electrical conductivity. Examples of the constituent material of the counter electrode 12 include metal materials (including alloys) such as Pt, Al, Cu, and Fe.

As the electrolytic solution 13, an electrolyte which is the same as that contained in the deformable material as described above can be used, however, it is possible that the whole or a part of the electrolyte is different. Further, the electrolytic solution 13 may be any as long as it is a liquid having electrical conductivity, however, a solution obtained by dissolving an ionic substance in a solvent can be favorably used.

Examples of the ionic substance include inorganic salts such as sodium chloride, lithium perchlorate, lithium trifluoromethane sulfonate, and lithium hexafluorophosphate; and tetrabutylammonium tetrafluoroborate.

As the solvent, for example, propylene carbonate or the like can be used.

Since the deformable material of the embodiment of the invention contains an electronically conductive substance, even if the deformable material layer 11 has a relatively large thickness, the whole deformable material layer 11 can be efficiently deformed by the oxidation-reduction reaction as described above. Therefore, a sufficiently large deformation amount (displacement amount) of the deformable material layer 11 as a whole can be obtained, and also a sufficiently large displacement force can be obtained.

As described above, the deformable material of the embodiment of the invention can be expanded (extended) and contracted a plurality of times by repeating expansion and contraction, and also the reproducibility of the expansion and contraction is excellent. Accordingly, the actuator of the embodiment of the invention can adopt not only the direct current structure as described above, but also an alternating current structure, and can be repeatedly expanded and contracted.

According to this, an actuator which can be largely displaced at a low voltage can be provided, and also the deformable material layer 11 formed of the deformable material of the embodiment of the invention can be made to operate more flexibly.

Hereinabove, preferable embodiments of the invention are described, however, the invention is not limited thereto.

For example, in the above-described embodiments, a case where the constituent unit of the stimulus-responsive compound contains: the unit A; the first unit B; the second unit B; the first unit C; and the second unit C, and the first unit C and the second unit C each have a polymerizable functional group is mainly described. However, in the embodiments of the invention, the stimulus-responsive compound may be any as long as the compound has a polymerizable functional group and changes its molecular structure according to an oxidation-reduction reaction, and the constituent unit is not limited to those having all of the above-described respective units.

The actuator of the embodiment of the invention may be any as long as it is produced using the deformable material of the embodiment of the invention, and is not limited to those having a structure shown in FIGS. 5 and 6, in other words, those having a deformable material layer formed of the deformable material of the embodiment of the invention and connected to a power source, a counter electrode connected to the power source, and an electrolytic solution interposed between the deformable material layer and the counter electrode.

EXAMPLES

Hereinafter, the invention will be described in more detail with reference to Examples, however, the invention is not limited only to these Examples.

Example 1

[1] Production of Constituent Unit

[1.1] Synthesis of Unit A

By using bromothiophene as a starting material, dimerization and bromination were performed using a catalyst containing zinc and nickel. Then, the introduction of an aldehyde group (formylation) was performed using DMF.

Subsequently, acetal protection of the aldehyde group using ethylene glycol was performed, and further bromine was replaced by a formyl group. Thereafter, by a reduction reaction with $NaBF_4$, a diol (corresponding to a unit A) having two hydroxy groups in a bithiophene backbone was obtained.

[1.2] Synthesis of Unit C and Unit D

First, n-butyl lithium was allowed to act on 1,2-difluorobenzene, and the resulting compound was treated with trimethyl borate, whereby 2,3-difluorophenylboronic acid was obtained.

Subsequently, 1-bromo-4-(3-butenyloxy)benzene was reacted with the obtained 2,3-difluorophenylboronic acid in the presence of a palladium catalyst, whereby a compound represented by the following formula (16) was obtained.

Subsequently, n-butyl lithium was allowed to act on the obtained compound represented by the following formula (16), and the resulting compound was treated with trimethyl borate, whereby a compound represented by the following formula (17) was obtained.

Then, the obtained compound represented by the following formula (17) was subjected to a coupling reaction with 1-bromo-4-iodobenzene, and the resulting compound was treated with n-butyl lithium and trimethyl borate, whereby a unit C represented by the following formula (18) was obtained.

Thereafter, the obtained bithiophene derivative was reacted with benzene dithiol in the presence of an acid catalyst, and the resulting compound was treated with 2,3-dichloro-5,6-dicyano-p-benzoquinone (DDQ). Then, boron tetrafluoride was added thereto, whereby a constituent unit (bithiophene derivative) represented by the following formula (19) having a unit A, units B (a first unit B and a second unit B), units C (a first unit C and a second unit C), and units D (a first unit D and a second unit D) was obtained.

In the formula (19), n is 4.

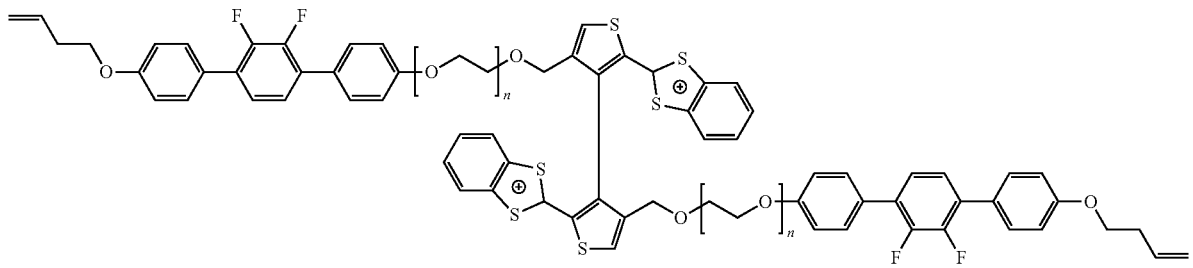

(19)

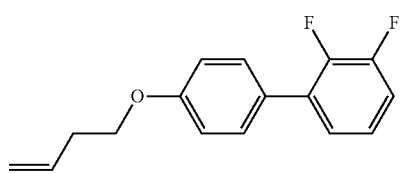

(16)

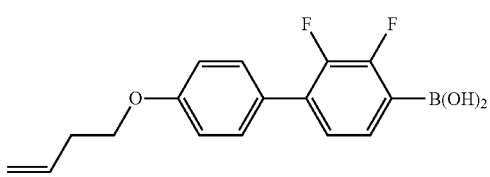

(17)

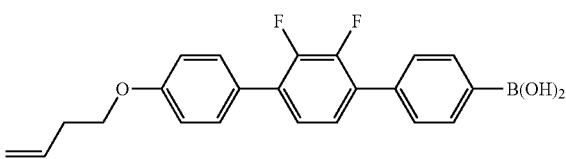

(18)

Subsequently, the obtained unit C represented by the above formula (18) and an oligoethylene glycol terminated with bromine were reacted with each other, whereby a liquid crystalline compound terminated with an oligoethylene oxide chain was obtained.

Further, by a reaction with p-toluenesulfonyl chloride, a liquid crystalline compound terminated with a p-toluene-sulfonyl group (corresponding to a unit C and a unit D) was obtained.

[1.3] Production of Constituent Unit

The diol synthesized in the above [1.1] and the liquid crystalline compound synthesized in the above [1.2] were reacted with each other in dimethylformamide (DMF) in the presence of sodium hydride, whereby a bithiophene derivative into which a liquid crystalline molecule was introduced was obtained.

[2] Production of Stimulus-Responsive Compound

The constituent unit produced in the above [1] was polymerized, whereby a stimulus-responsive compound was obtained.

[3] Production of Liquid Crystalline Polymer

[3.1] Synthesis of Monomer 1-(8-Hydroxyoctyl-1-oxy)-4-[2,3-difuloro-4-(4-butoxyphenyl)phenyl]benzene (represented by the following formula (20)) and triethylamine were dissolved in THF, and the resulting mixture was cooled to 0° C., and then, methacryloyl chloride was added dropwise thereto. After the mixture was stirred for 4 hours, water was added thereto, and extraction with dichloromethane was performed three times. The organic layer was washed with water and a saturated aqueous sodium chloride solution, and then, dehydrated with sodium sulfate, and concentrated by filtration. Then, the concentrated mixture was purified by column chromatography, whereby a target compound was obtained.

In the formula (20), R is $C_4H_9$.

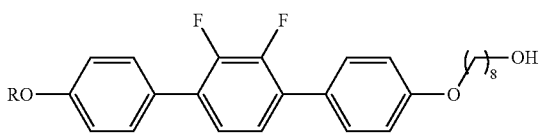

(20)

In this manner, a monomer represented by the above formula (14) (wherein n is 8, and R is $C_4H_9$) was obtained.

[3.2] Production of Liquid Crystalline Polymer

The monomer (100 parts by mass) obtained in the above, bisacryloyloxyhexane (10 parts by mass) as a crosslinking agent, and azobisisobutyronitrile (1 part by mass) as an initiator were placed in a Schlenk flask and dissolved in toluene, and then, dissolved oxygen in the solvent was removed by three cycles of freeze-pump-thaw degassing. Thereafter, the resulting solution was stirred under a nitrogen atmosphere at 95° C. for 26 hours. After the solution was cooled, the solvent was distilled off, and the resulting residue was dissolved in a minimum amount of tetrahydrofuran. The resulting solution was added dropwise to acetone, and the deposited precipitate was filtered and then dried under vacuum, whereby a liquid crystalline polymer (weight average molecular weight: 30,000) was obtained.

[4] Mixing of Liquid Crystalline Polymer and Vinylidene Fluoride-Propylene Hexafluoride Copolymer Thereafter, the liquid crystalline polymer obtained as described above (1 part by mass) and a vinylidene fluoride-propylene hexafluoride copolymer (weight average molecular weight: 150,000, 2 parts by mass) were mixed with each other.

[5] Production of Deformable Material

The stimulus-responsive compound obtained as described above, the liquid crystalline polymer, the vinylidene fluoride-propylene hexafluoride copolymer, carbon nanoparticles (Ketchen Black EC300J, manufactured by Lion Corporation) having an average particle diameter of 39.5 nm and a porosity of 60 vol % as a porous body having interconnected pores, propylene carbonate as a solvent, and lithium hexafluorophosphate as an electrolyte were mixed. Then, the resulting mixture was molded using a mold having a given shape, whereby a deformable material in the form of a gel was obtained.

[6] Production of Actuator

By using the deformable material obtained as described above, an actuator as shown in FIG. 5 was produced.

The deformable material obtained as described above was cut into a piece with a size of 2.0 cm in length, 0.3 cm in width, and 0.05 mm in thickness, and an actuator as shown in FIG. 5 was produced by using this piece as a deformable material layer. As a counter electrode, a plate material made of platinum (Pt) was used, and as an electrolytic solution, a 1 M solution of lithium hexafluorophosphate in propylene carbonate was used.

Examples 2 to 7

Deformable materials and actuators were produced in the same manner as in the above-described Example 1 except that the configuration of the deformable material was changed as shown in Table 1.

Comparative Example 1

A deformable material and an actuator were produced in the same manner as in the above-described Example 1 except that the electronically conductive substance was not used.

The configuration and the like of the deformable materials of the above-described respective Examples and Comparative Example are summarized in Table 1. In the table, the compound (constituent unit) represented by the above formula (19) is expressed as "A1", the compound (constituent unit) represented by the following formula (21) is expressed as "A2", the compound (constituent unit) represented by the following formula (22) is expressed as "A3", the monomer represented by the above formula (13) is expressed as "M1", the monomer represented by the above formula (14) is expressed as "M2", bisacryloyloxyhexane as the crosslinking agent is expressed as "B1", the vinylidene fluoride-propylene hexafluoride copolymer (weight average molecular weight: 150,000) is expressed as "PVdF", carbon nanoparticles (Ketchen Black EC300J, manufactured by Lion Corporation) having an average particle diameter of 39.5 nm and a porosity of 60 vol % as the electronically conductive substance is expressed as "C1", carbon nanoparticles (Ketchen Black EC300J, manufactured by Lion Corporation) having an average particle diameter of 34.0 nm and a porosity of 80 vol % as the electronically conductive substance is expressed as "C2", propylene carbonate as the solvent is expressed as "S1", and lithium hexafluorophosphate as the electrolyte is expressed as "E1". Further, the deformable materials of the above-described respective Examples and Comparative Example were all in the form of a gel.

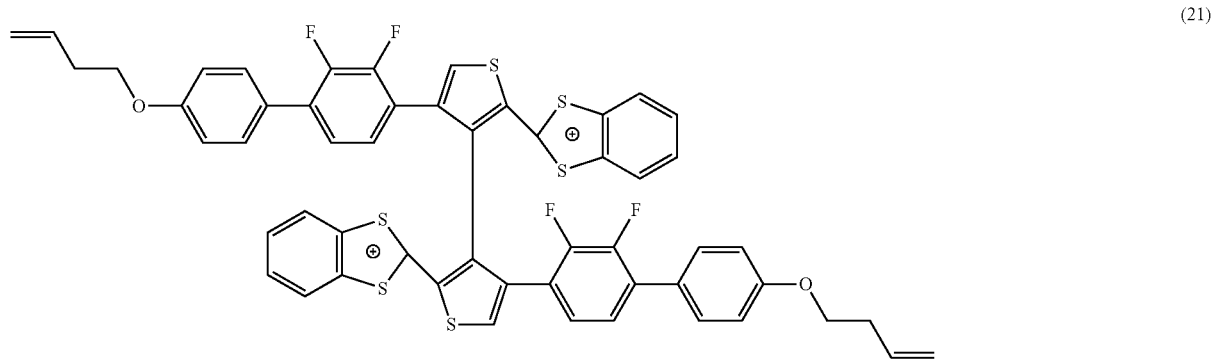

(21)

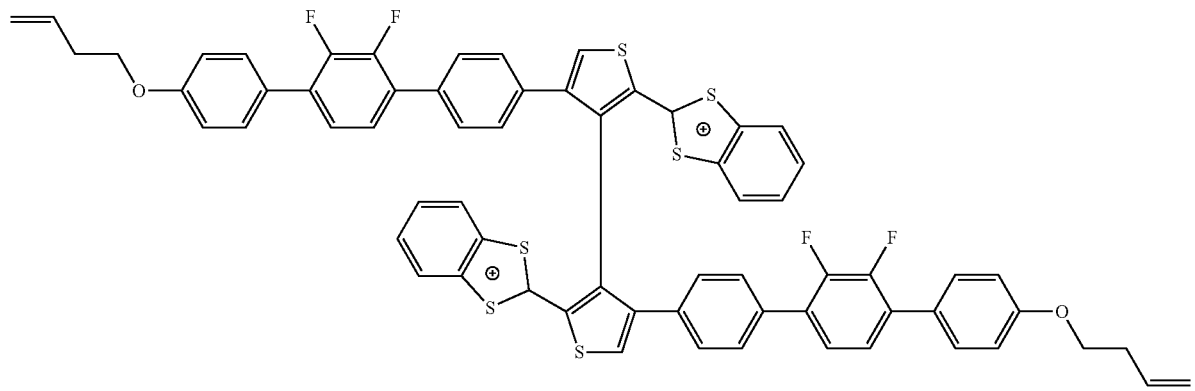

(22)

TABLE 1

| | Constituent material | | | | | | | |
|---|---|---|---|---|---|---|---|---|
| | Polymer material | | | | | | | |
| | Stimulus-responsive compound | | Liquid crystalline polymer | | | | Other polymer material | |
| | Type of constituent unit | Content [% by mass] | Constituent monomer | Crosslinking agent | Mw | Content [% by mass] | Type | Content [% by mass] |
| Example 1 | A1 | 20 | M2 | B1 | 30,000 | 5 | PVdf | 10 |
| Example 2 | A1 | 20 | M1 | B1 | 30,000 | 5 | PVdf | 10 |
| Example 3 | A2 | 20 | M2 | B1 | 30,000 | 5 | PVdf | 10 |
| Example 4 | A3 | 20 | M2 | B1 | 30,000 | 5 | PVdf | 10 |
| Example 5 | A1 | 20 | M2 | B1 | 30,000 | 5 | PVdf | 10 |
| Example 6 | A1 | 20 | — | — | — | — | PVdf | 15 |
| Example 7 | A1 | 20 | M2 | B1 | 30,000 | 15 | — | — |
| Comparative Example 1 | A1 | 20 | M2 | B1 | 30,000 | 5 | PVdf | 45 |

| | Constituent material | | | | | | | |
|---|---|---|---|---|---|---|---|---|
| | Electronically conductive substance | | | | Solvent | | Electrolyte | |
| | Type | Particle diameter [nm] | Porosity [vol %] | Content [% by mass] | Type | Content [% by mass] | Type | Content [% by mass] | Electrical conductivity [S/cm] |
| Example 1 | C1 | 39.5 | 60 | 30 | S1 | 30 | E1 | 5 | 10 |
| Example 2 | C1 | 39.5 | 60 | 30 | S1 | 30 | E1 | 5 | 13 |
| Example 3 | C1 | 39.5 | 60 | 30 | S1 | 30 | E1 | 5 | 12 |
| Example 4 | C1 | 39.5 | 60 | 30 | S1 | 30 | E1 | 5 | 11 |
| Example 5 | C2 | 34.0 | 80 | 30 | S1 | 30 | E1 | 5 | 50 |
| Example 6 | C1 | 39.5 | 60 | 30 | S1 | 30 | E1 | 5 | 12 |
| Example 7 | C1 | 39.5 | 60 | 30 | S1 | 30 | E1 | 5 | 15 |
| Comparative Example 1 | — | — | — | 0 | S1 | 30 | E1 | 5 | 0 |

[7] Evaluation of Actuators

[7.1] Deformation Amount

While maintaining the temperature of the electrolytic solution at 25° C., the direction of flow of electric current was inverted as shown in FIG. 6, and the displacement amount in the longitudinal direction of the deformable material layer was measured using a laser displacement meter, and the evaluation was performed according to the following criteria. Incidentally, a voltage of 5 V was applied during the measurement.

A: The displacement amount was 12 mm or more.

B: The displacement amount was 10 mm or more and less than 12 mm.

C: The displacement amount was 8 mm or more and less than 10 mm.

D: The displacement amount was 6 mm or more and less than 8 mm.

E: The displacement amount was less than 6 mm.

TABLE 2

| | Displacement amount |
|---|---|
| Example 1 | A |
| Example 2 | B |
| Example 3 | B |
| Example 4 | A |
| Example 5 | A |
| Example 6 | C |
| Example 7 | C |
| Comparative Example 1 | E |

As apparent from Table 2, according to the embodiments of the invention, the whole deformable material could be largely displaced at a relatively low voltage, and also even if the thickness of the deformable material was large, the whole deformable material could be efficiently deformed, and a sufficiently large displacement force and displacement amount could be obtained at a low voltage. Further, according to the embodiments of the invention, the deformable material had an excellent response speed. In addition, according to the embodiments of the invention, the operability in a low-temperature range and also the durability were excellent. On the other hand, in the case of Comparative Example, satisfactory results could not be obtained.

The entire disclosure of Japanese Patent Application No. 2012-133200, filed Jun. 12, 2012 is expressly incorporated reference herein.

That is claimed is:

1. A deformable material, comprising:
   a stimulus-responsive compound whose molecular structure is changed according to an oxidation-reduction reaction; and
   an electronically conductive substance, wherein
   the stimulus-responsive compound is a polymer obtained by polymerizing a constituent unit having a polymerizable functional group.

2. The deformable material according to claim 1, wherein the deformable material is in the form of a gel.

3. The deformable material according to claim 1, wherein the electronically conductive substance contains a carbon material.

4. The deformable material according to claim 1, wherein the electronically conductive substance is in the form of particles.

5. The deformable material according to claim 4, wherein the electronically conductive substance has an average particle diameter of 1 nm or more and 10 μm or less.

6. The deformable material according to claim 1, wherein the polymerizable functional group is a vinyl group or a (meth)acrylic group.

7. The deformable material according to claim 1, wherein the constituent unit contains a functional group having liquid crystallinity.

8. The deformable material according to claim 7, wherein the constituent unit has a structure in which the functional group having liquid crystallinity and the polymerizable functional group are disposed through a linking group.

9. The deformable material according to claim 1, wherein the constituent unit contains:
   a unit A having a bond which functions as a rotation axis;
   a first unit B which is disposed at a first bonding site of the unit A;
   a second unit B which is disposed at a second bonding site of the unit A;
   a first unit C; and
   a second unit C, wherein
   the first unit B and the second unit B are bonded to each other by a reduction reaction, and
   the first unit C and the second unit C each have the polymerizable functional group.

10. The deformable material according to claim 9, wherein the unit A is at least one group selected from the group consisting of groups represented by the following formula (1), (2), or (3):

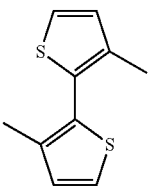

(1)

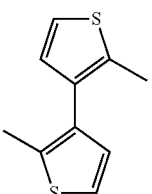

(2)

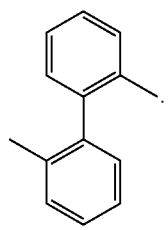

(3)

11. The deformable material according to claim 9, wherein the first unit B and the second unit B are each a group represented by the following formula (4):

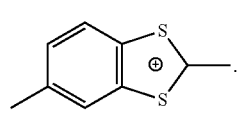

(4)

12. The deformable material according to claim 9, wherein the first unit C and the second unit C each have the functional group having liquid crystallinity.

13. The deformable material according to claim 1, further comprising at least one member selected from the group consisting of a vinylidene fluoride-propylene hexafluoride copolymer, methyl poly(meth)acrylate, and an organic electrolyte oligomer.

14. An actuator, which is produced using the deformable material according to claim 1.

15. An actuator, which is produced using the deformable material according to claim 2.

16. An actuator, which is produced using the deformable material according to claim 3.

17. An actuator, which is produced using the deformable material according to claim 4.

18. An actuator, comprising:
   a deformable material layer containing the deformable material according to claim 1;

a counter electrode; and an electrolytic solution which is interposed between the deformable material layer and the counter electrode.

19. An actuator, comprising:

a deformable material layer containing the deformable material according to claim 2;

a counter electrode; and an electrolytic solution which is interposed between the deformable material layer and the counter electrode.

20. An actuator, comprising:

a deformable material layer containing the deformable material according to claim 3;

a counter electrode; and an electrolytic solution which is interposed between the deformable material layer and the counter electrode.

* * * * *